US011876550B2

(12) United States Patent
Chen et al.

(10) Patent No.: US 11,876,550 B2
(45) Date of Patent: Jan. 16, 2024

(54) SUPPORTER

(71) Applicant: Wistron Corp., New Taipei (TW)

(72) Inventors: Chun-Chien Chen, New Taipei (TW);
Chen Yi Liang, New Taipei (TW);
Tzu-Ying Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 129 days.

(21) Appl. No.: 17/398,974

(22) Filed: Aug. 10, 2021

(65) Prior Publication Data

US 2022/0393713 A1    Dec. 8, 2022

(30) Foreign Application Priority Data

Jun. 4, 2021 (TW) ................................. 110120353

(51) Int. Cl.
| | |
|---|---|
| *H04B 1/3877* | (2015.01) |
| *F16M 11/22* | (2006.01) |
| *F16M 13/06* | (2006.01) |
| *G06F 1/16* | (2006.01) |
| *H02J 50/90* | (2016.01) |
| *H05K 7/14* | (2006.01) |

(52) U.S. Cl.
CPC ........... *H04B 1/3877* (2013.01); *F16M 11/22* (2013.01); *F16M 13/06* (2013.01); *H02J 50/90* (2016.02); *G06F 1/1632* (2013.01); *H05K 7/14* (2013.01)

(58) Field of Classification Search
CPC ....... H04B 1/3877; H02J 50/90; F16M 11/22; F16M 13/06; G06F 1/1632; H05K 7/14
See application file for complete search history.

(56) References Cited

U.S. PATENT DOCUMENTS

| | | | | |
|---|---|---|---|---|
| 6,216,195 | B1 * | 4/2001 | Lee ........................ | G06F 1/1632 361/679.55 |
| 8,986,029 | B2 * | 3/2015 | Webb ....................... | H05K 7/14 439/248 |
| 9,778,690 | B2 * | 10/2017 | Ardisana, II .......... | G06F 1/1632 |
| 2010/0158297 | A1 * | 6/2010 | Stuczynski ........... | G06F 1/1632 439/529 |
| 2011/0117833 | A1 * | 5/2011 | Hong ..................... | H01R 13/60 455/3.06 |
| 2013/0092811 | A1 * | 4/2013 | Funk ...................... | G06F 1/1632 248/371 |
| 2020/0400268 | A1 * | 12/2020 | Yang .................... | G08B 13/1418 |
| 2021/0081001 | A1 * | 3/2021 | Huang ................... | G06F 1/1626 |

* cited by examiner

*Primary Examiner* — Tan Le (57) ABSTRACT

A supporter is provided. The supporter includes a base, a holder, a positioning member, a connecting rod assembly, and a power assembly. The holder is connected to the base and has a through-hole. The positioning member is disposed in the through-hole of the holder. The connecting rod assembly is disposed on the holder and connected to the positioning member. The power assembly is movably disposed on the holder via the connecting rod assembly. Accordingly, the power assembly is movable in response to the position of the electronic device, which achieves good recharge efficiency whether the electronic device is arranged upright or horizontally.

16 Claims, 11 Drawing Sheets

SUPPORTER

CROSS REFERENCE TO RELATED APPLICATIONS

This application claims priority of Taiwan Patent Application No. 110120353, filed on Jun. 4, 2021, the entirety of which is incorporated by reference herein.

BACKGROUND

Technical Field

The disclosure relates to a supporter, and in particular to a supporter including a connecting rod assembly so that the power assembly is movably disposed on the holder.

Description of the Related Art

With the development of technology, the application of electronic devices has become more and more popular. In particularly, portable electronic devices (such as laptops, tablets, cell phones, etc.) have increasingly been favored by consumers because of their convenience. These portable electronic devices need to be charged when the power is exhausted. Therefore, there are many bases and charging modules provided for portable electronic devices on the market. However, the existing base and charging module are not satisfactory in all aspects, and there is still room for improvements.

BRIEF SUMMARY

The present disclosure provides a supporter. The supporter includes a base, a holder, a positioning member, a connecting rod assembly, and a power assembly. The holder is connected to the base and has a through-hole. The positioning member is disposed in the through-hole of the holder. The connecting rod assembly is disposed on the holder and connected to the positioning member. The power assembly is movably disposed on the holder via the connecting rod assembly.

The present disclosure provides a supporter configured to hold an electronic device. The supporter includes a base, a holder, a positioning member, a connecting rod assembly, and a power assembly. The holder is connected to the base and has a through-hole. The positioning member is disposed in the through-hole of the holder. The connecting rod assembly is disposed on the holder and connected to the positioning member. The power assembly is movably disposed on the holder via the connecting rod assembly. The electronic device abuts the holder and the base and is electrically connected to the power assembly.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

The supporters and electronic assemblies of some embodiments of the present disclosure are described in the following description. However, it should be appreciated that the following detailed description of some embodiments of the disclosure provides various concepts of the present disclosure which may be performed in specific backgrounds that may vary widely. The specific embodiments disclosed are provided merely to clearly describe the usage of the present disclosure by some specific methods without limiting the scope of the present disclosure.

In addition, relative terms such as "lower" or "bottom," "upper" or "top" may be used in the following embodiments in order to describe the relationship between one element and another element in the figures. It should be appreciated that if the device shown in the figures is flipped upside-down, the element located on the "lower" side may become the element located on the "upper" side.

It should be understood that although the terms "first," "second," etc. may be used herein to describe various elements, materials and/or portions, these elements, materials and/or portions are not limited by the above terms. These terms merely serve to distinguish different elements, materials and/or portions. Therefore, a first element, material and/or portion may be referred to as a second element, material and/or portion without departing from the teaching of some embodiments in the present disclosure. Unless defined otherwise, the first or second element, material and/or portion in the claims may be interpreted as any element, material and/or portion in the specification as long as it conforms to the description in the claims.

Unless defined otherwise, all terms (including technical and scientific terms) used herein have the same meaning as commonly understood by one of ordinary skill in the art to which the present disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "approximately" or "about" may also be recited in the present disclosure, and these terms are intended to encompass situations or ranges that is substantially or exact the same as the description herein. It should be noted that unless defined specifically, even if the above terms are not recited in the description, it should be read as the same meaning as those approximate terms are recited.

Figure 1:
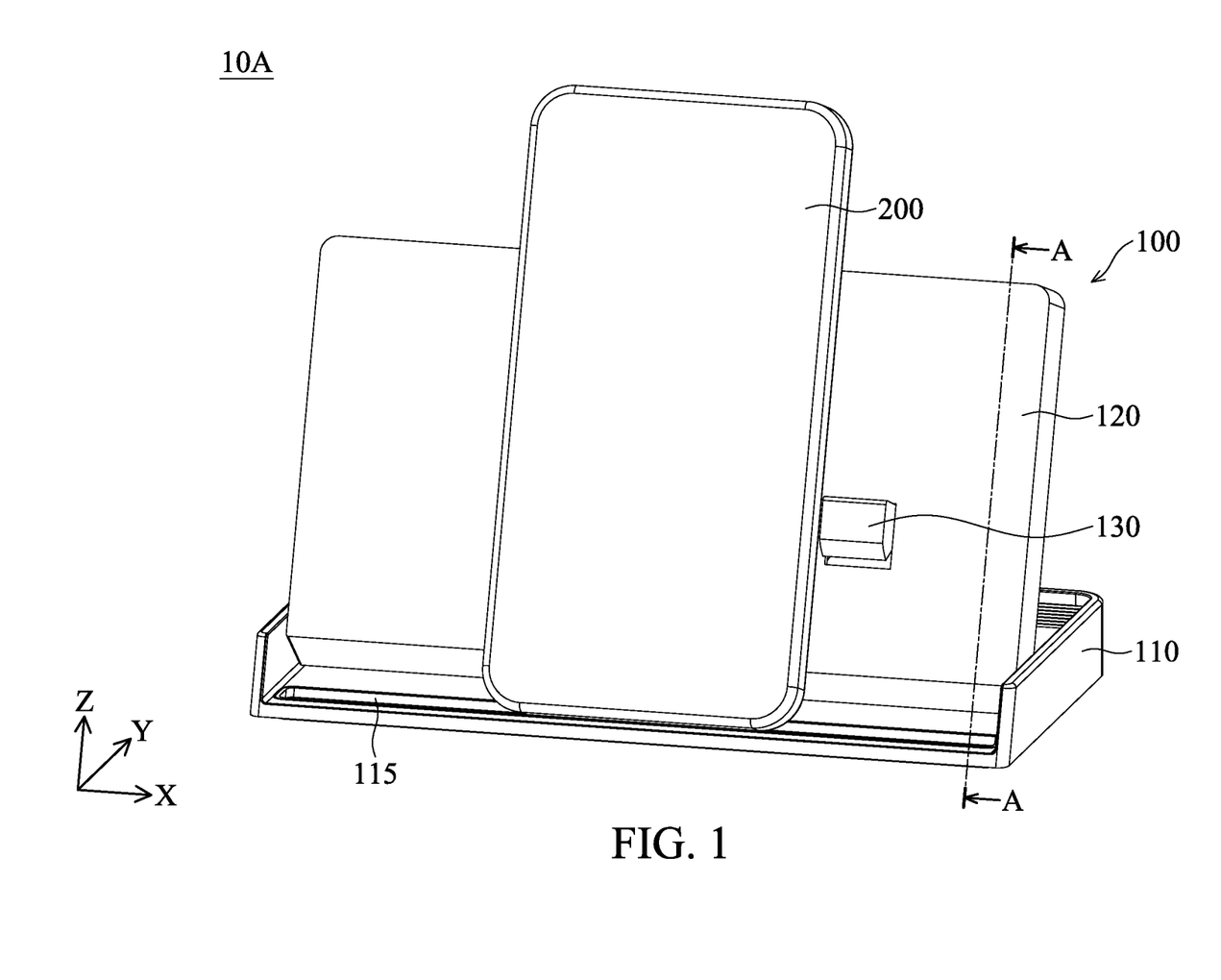
FIG. 1 illustrates a perspective view of an electronic assembly in accordance with some embodiments of the present disclosure.

FIG. 1 illustrates a perspective view of an electronic assembly 10A in accordance with some embodiment of the present disclosure. As shown in FIG. 1, the electronic assembly 10A may include a supporter 100 and an electronic device 200. The electronic device 200 may include a portable device (for example, mobile phone or any other suitable electronic device), but the present disclosure is not limited thereto. In some embodiments, the supporter 100 includes a base 110, a holder 120, and a positioning member 130. The holder 120 is disposed over the base 110, and an angle is formed between the holder 120 and the base 110. The positioning member 130 is disposed on the holder 120 and exposed from a through-hole of the base 120. In some embodiments, the base 110 further includes a slot 115 disposed on the upper surface of the base 110. In some embodiments, the base 110 and the slot 115 belong to different components. The electronic device 200 may be disposed on the slot 115 in an upright manner, that is, the short side of the electronic device 200 abuts the slot 115 and the electronic device 200 abuts the holder 120. In this way, the electronic device 200 may be supported at an appropriate angle. In some embodiments, the long side of the electronic device 200 may abut the positioning member 130 to position the electronic device 200 in a proper position. In some embodiments, the base 110 may have a protruding portion (not shown). When the electronic device 200 abuts against the holder 120, the protruding portion of the base 110 may serve as a stopper and is suitable for abutting the electronic device 200 and restricting the electronic device 200 at a position where the electronic device 200 abuts against the holder 120, thereby preventing the electronic device 200 from slipping away from the holder 120. In other embodiments, an anti-slip portion (not shown) may be installed on the surface, which contacts the electronic device 200, of the base 110 to achieve the same effect.

The detailed structure of the supporter 100 will be further described below. In some embodiments, the supporter 100 may be coupled to any suitable electronic apparatus (not shown, such as a display apparatus, an electronic computer, etc.).

Figure 2:
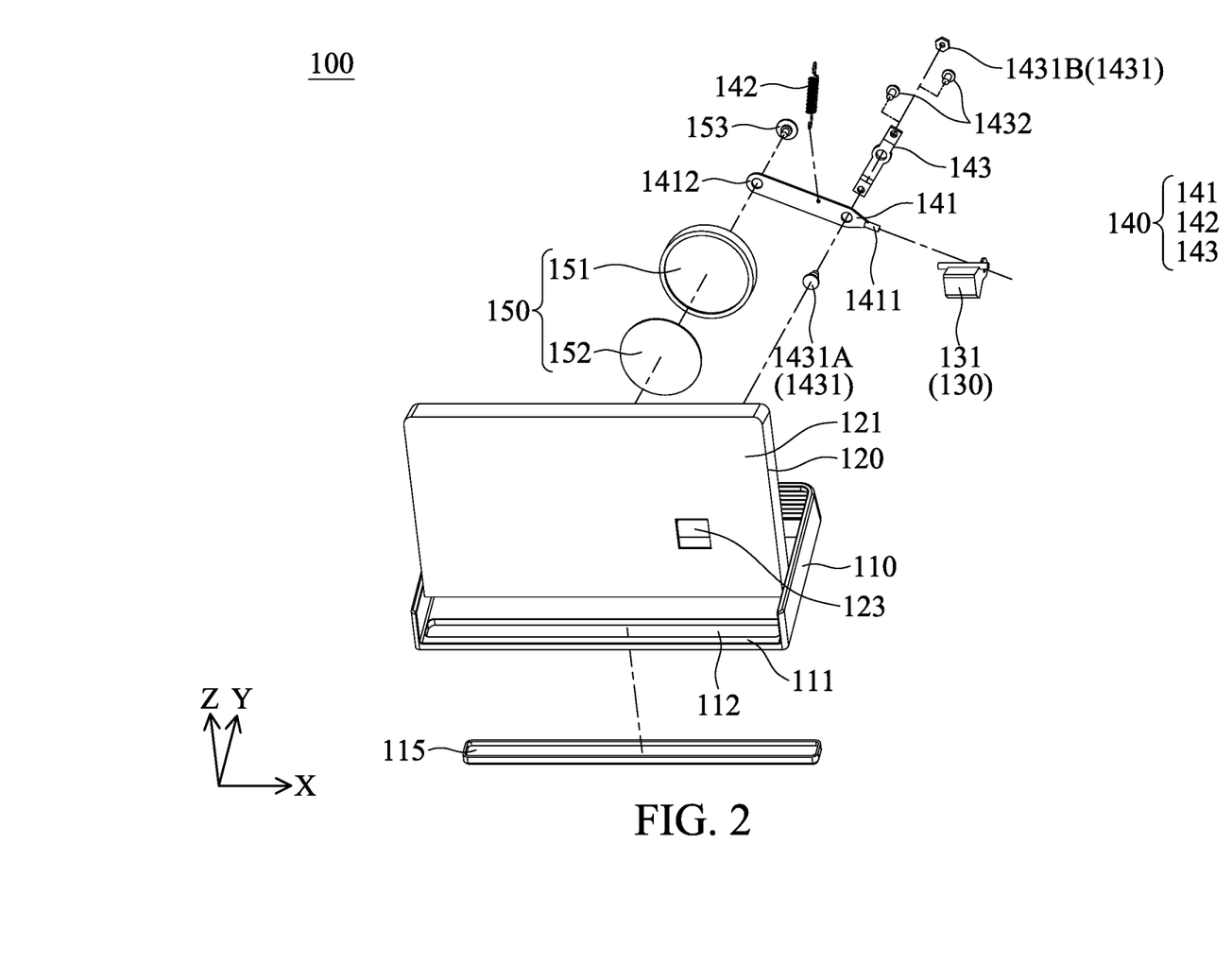
FIG. 2 illustrates an exploded view of a supporter in accordance with some embodiments of the present disclosure.

FIG. 2 illustrates an exploded view of the supporter 100 in accordance with some embodiments of the present disclosure. As shown in FIG. 2, the base 110 has an upper surface 111 and a recess 112 that is recessed inwardly from the upper surface 111. In some embodiments, the recess 112 may serve as a stopper, which is suitable for abutting against the electronic device 200 and restricting the electronic device 200 at a position where the electronic device 200 abuts against the holder 120. In the present embodiment, the upper surface 111 may be substantially parallel to a horizontal plane (for example, the X-Y plane), but the present disclosure is not limited thereto. The recess 112 may have a slot 115 to accommodate the electronic device 200. In some embodiments, the recess 112 may penetrate the base 110 so that the slot 115 is exposed on the bottom surface of the supporter 100. However, the configuration shown in the present disclosure is only an example, and it is not intended to limit the scope of the present disclosure. In some embodiments, the recess 112 may not penetrate the base 110. In some embodiments, the slot 115 may be omitted, so that the electronic device 200 is directly disposed in the recess 112 of the base 110.

In addition, the holder 120 has a front surface 121 and a through-hole 123 formed in the front surface 121. In this embodiment, the front surface 121 may be a surface provided for the electronic device 200 to rest. In some embodiments, the through-hole 123 may be a rectangular through-hole and penetrates the holder 120, but the present disclosure is not limited thereto. The positioning member 130 may has an abutting portion 131, and the shape and position of the through-hole 123 may correspond to the abutting portion 131 of the positioning member 130 so that the positioning member 130 is movable through the through-hole 123. In some embodiments, the through-hole 123 may expose the abutting portion 131 of the positioning member 130.

Furthermore, the supporter 100 further includes a connecting rod assembly 140 and a power assembly 150. In some embodiments, the connecting rod assembly 140 includes a connecting rod 141 that has a first end 1411 and a second end 1412 opposite to each other. The first end 1411 may be connected to the positioning member 130, and the second end 1412 may be connected to the power assembly 150. In some embodiments, the power assembly 150 includes a carrier 151 and a power module 152. The carrier 151 may be arranged around the power module 152 and protect the power module 152. The carrier 151 may force the power module 152 to abut the holder 120 to achieve a good protection effect, but the present disclosure is not limited thereto. The power module 152 may have a function of charging the electronic device 200. In some embodiments, the fixed member 153 passes through the through-hole of the connecting rod 141 to affix the power assembly 150 to the second end 1412 of the connecting rod 141. With the above configuration, the positioning member 130 and the power assembly 150 are respectively located at opposite ends of the connecting rod 141 and is movable in conjunction with each other.

In some embodiments, the connecting rod assembly 140 further includes a restoring member 142 disposed to connect the holder 120 and the connecting rod 141. In this embodiment, the restoring member 142 may serve as a balance element of the supporter 100, and may apply force to the connecting rod 141 to position the positioning member 130 and the power assembly 150 at a specific position. Although the restoring member 142 is shown as a spring in this embodiment, the present disclosure is not limited thereto. Any component that may apply force to the connecting rod 141 to restore the positioning member 130 and the power assembly 150 is acceptable. For example, the restoring member 142 may also be a hydraulic element or any other suitable extendable element.

As shown in FIG. 2, the connecting rod assembly 140 further includes a fixed rod 143, and the connecting rod 141 is connected to the holder 120 via the fixed rod 143. To be more specific, the connecting rod 141 locks the fixed rod 143 to the holder 120 via fixed members 1432. Although two fixed members 1432 are shown in this embodiment, the present disclosure is not limited thereto. In addition, the fixed rod 143 may be pivoted to the connecting rod 141 via a fixed member 1431, and the connecting rod 141 rotates relative to the fixed rod 143 about the fixed member 1431, which serves as a rotation axis. For example, in this embodiment, the fixed member 1431 includes a screw 1431A and a nut 1431B that are combined with each other, but the present disclosure is not limited thereto. Any element that may affix the fixed rod 143 and the connecting rod 141 is acceptable.

Figure 3:
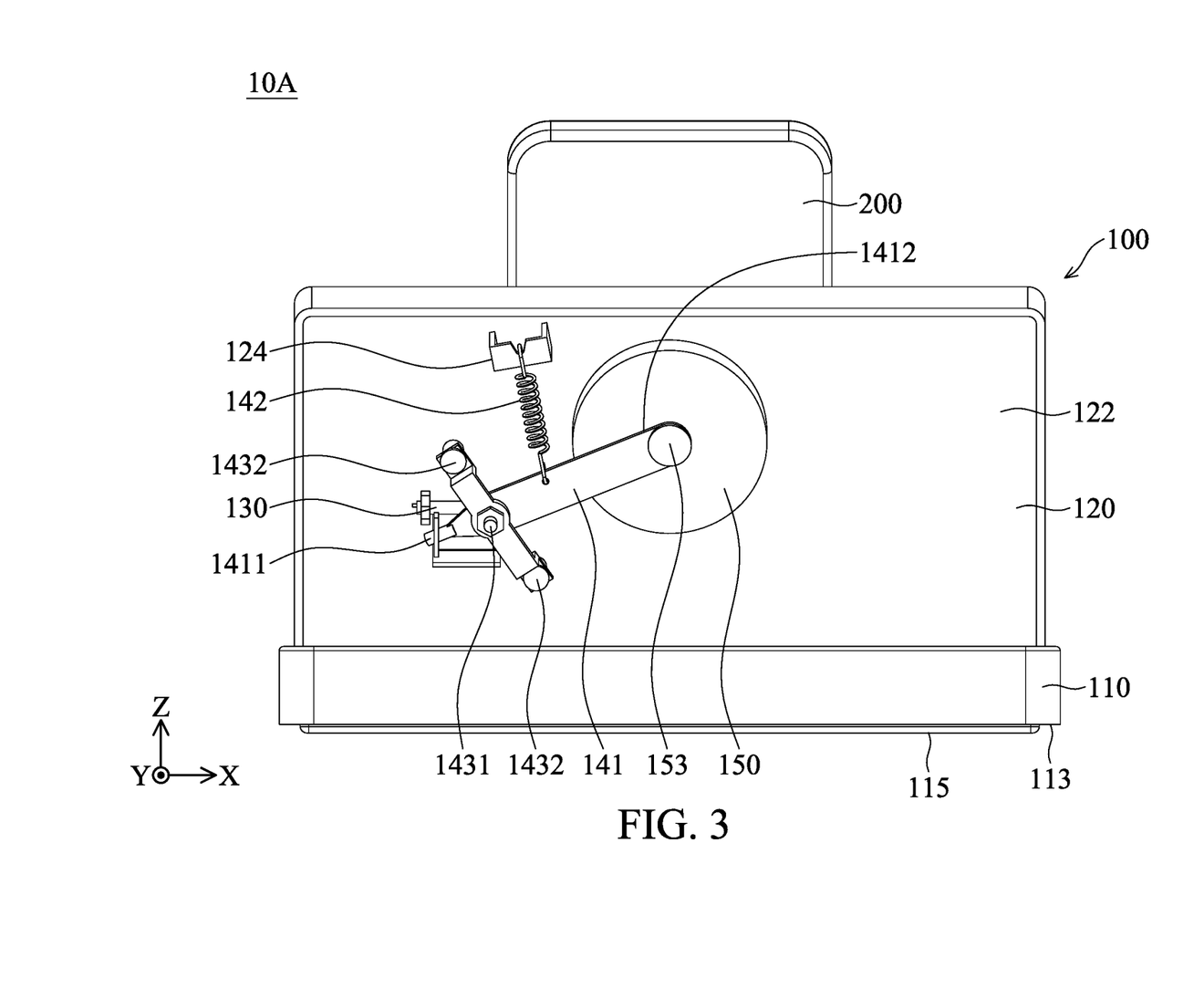
FIG. 3 illustrates a rear view of the electronic assembly in accordance with some embodiments of the present disclosure.

FIG. 3 illustrates a rear view of the electronic assembly 10A in accordance with some embodiments of the present disclosure. As shown in FIG. 3, the holder 120 has a rear surface 122 and a connecting portion 124 formed on the rear surface 122. In this embodiment, the rear surface 122 is a surface facing the power assembly 150 and opposite to the front surface 121. In other embodiments, the holder 120 has an accommodating space (not labeled) at a position opposite to the front surface 121, and the rear surface 122 may be the bottom surface of the accommodating space. The accommodating space is configured to accommodate the connecting rod assembly 140 and the power assembly 150. The power assembly 150 may be disposed between the rear surface 122 of the holder 120 and the base 110. In some embodiments, the connecting portion 124 may be designed to connect the restoring member 142. The shape and position of the connecting portion 124 may correspond to that of the restoring member 142. In some embodiments, the position of the connecting portion 124 may enable the restoring member 142 to be located between the fixed member 1431 and the power assembly 150.

Moreover, in some embodiments, on the connecting rod 141, the distance between the restoring member 142 and the fixed member 1431 of the fixed rod 143 in a horizontal direction (for example, the X direction) is smaller than the distance between the restoring member 142 and the fixed member 153 of the power assembly 150 in the horizontal direction (for example, the X direction). In the absence of external force, the force applied by the restoring member 142 to the connecting rod 141 may hold the power assembly 150 at the initial position. For example, when the electronic device 200 is upright, the power assembly 150 corresponds to the center of the electronic device 200, thereby improving the charging efficiency of the electronic device 200. In some embodiments, the slot 115 may protrude from the lower surface 113 of the base 110, but the present disclosure is not limited thereto. The slot 115 may also serve as a buffer between the base 110 and the lower device. The slot 115 may absorb the impact of external force on the supporter 100, or reduce the probability of the supporter 100 sliding and shifting. In some embodiments, a plurality of buffers (not shown) may be disposed under the base 110. In some embodiments, the bottom of the slot 115 may be level with the lower surface 113 of the base 110.

Figure 4:
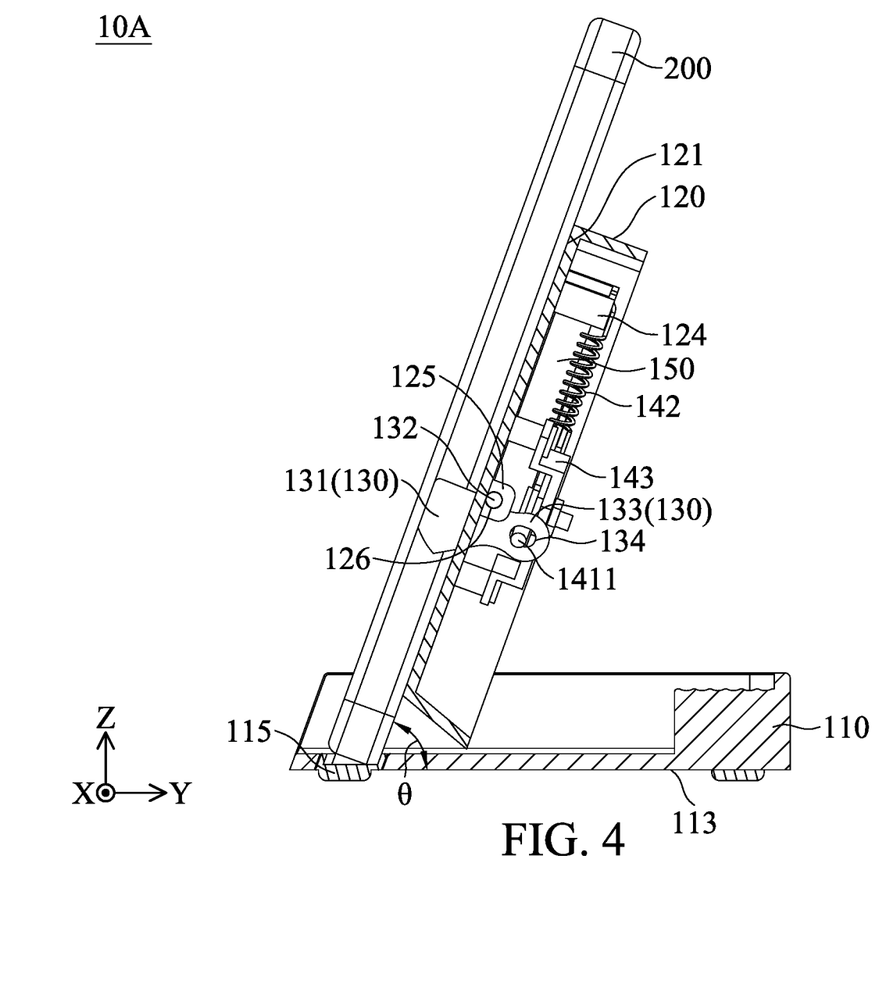
FIG. 4 illustrates a cross-sectional view of the electronic assembly in accordance with some embodiments of the present disclosure.

FIG. 4 illustrates a cross-sectional view of the electronic assembly 10A in accordance with some embodiments of the present disclosure. As shown in FIG. 4, the holder 120 has an extending portion 125 that extends outwardly away from the rear surface 122. The extending portion 125 has a hole 126 that is configured to correspond to the protruding post 132 of the positioning member 130. In some embodiments, the hole 126 may be substantially parallel to the Y-Z plane, and the protruding post 132 may pass through the hole 126 (that is, extend in a direction substantially perpendicular to the Y-Z plane). It should be understood that in this embodiment, two sets of opposite holes 126 and protruding posts 132 may be disposed, so that the positioning member 130 can rotate relative to the holder 120 about the protruding post 132, which serve as a rotation axis. In some embodiments, the rotation axis (for example, the protruding post 132) of the positioning member 130 is substantially perpendicular to the rotation axis (for example, the fixed member 1431) of the connecting rod 141.

In addition, the positioning member 130 further has an extending portion 133, the extending portion 133 has a hole 134, and the extending portion 133 is provided on the rear surface 122 of the holder 120. In some embodiments, the extending portion 133 is disposed in the accommodating space of the holder 120, and the abutting portion 131 is exposed from the through-hole 123 of the holder 120. In some embodiments, the hole 134 may be substantially parallel to the Y-Z plane, and the first end 1411 of the connecting rod 141 may pass through the hole 134. In some embodiments, the first end 1411 of the connecting rod 141 may be cylindrical. The size of the hole 134 on the Y-Z plane may be larger than the size of the first end 1411 of the connecting rod 141 on the Y-Z plane, so that the first end 1411 is movable in the hole 134. For example, the cross-section of the hole 134 on the Y-Z plane may be an ellipse, but it may also be a circle, any regular shape or irregular shape. In this embodiment, the positioning member 130 may extend to protrude from the front surface 121 of the holder 120. At this time, the first end 1411 of the connecting rod 141 may abut the end, which close to the protruding post 132, of the hole 134.

In some embodiments, the sidewall of the slot 115 may be substantially parallel to the front surface 121 of the holder 120, so that the electronic device 200 disposed in the slot 115 may smoothly abut against the front surface 121. In this embodiment, the angle θ between the electronic device 200 and the horizontal plane (such as the X-Y plane) may be in the range from 35 degrees to 65 degrees, but it is only an example and is not intended to limit the scope of the present disclosure. Accordingly, the above-mentioned angular relationship also exists between the front surface 121 and the horizontal plane and between the sidewall of the slot 115 and the horizontal plane (that is, the same angle θ is formed therebetween). In addition, in some embodiments, a bracket (not shown) may be disposed between the base 110 and the holder 120 to support the electronic device 200 more stably.

Figure 5:
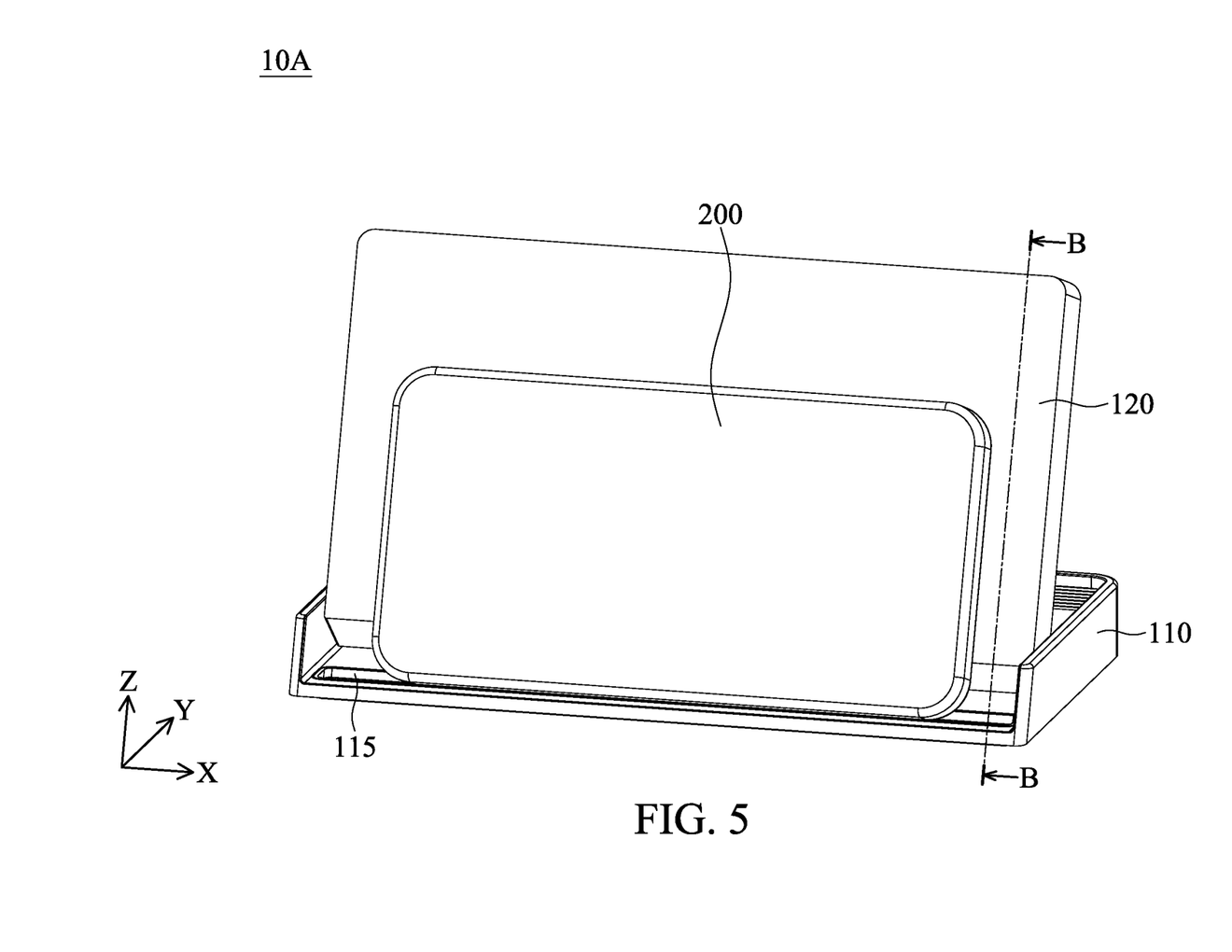
FIG. 5 illustrates a perspective view of the electronic assembly in accordance with some embodiments of the present disclosure.

FIG. 5 illustrates a perspective view of the electronic assembly 10A in accordance with some embodiments of the present disclosure. As shown in FIG. 5, the electronic device 200 may be disposed on the slot 115 in a horizontally placed manner, that is, the long side of the electronic device 200 abuts against the slot 115. At this time, the electronic device 200 abuts the holder 120 and contacts the abutting portion 131 of the positioning member 130. As such, the weight of the electronic device 200 may be used to push the positioning member 130 so that the positioning member 130 rotates relative to the holder 120 toward the rear surface 122. The movement mode of the positioning member 130 will be further described below.

Figure 6:
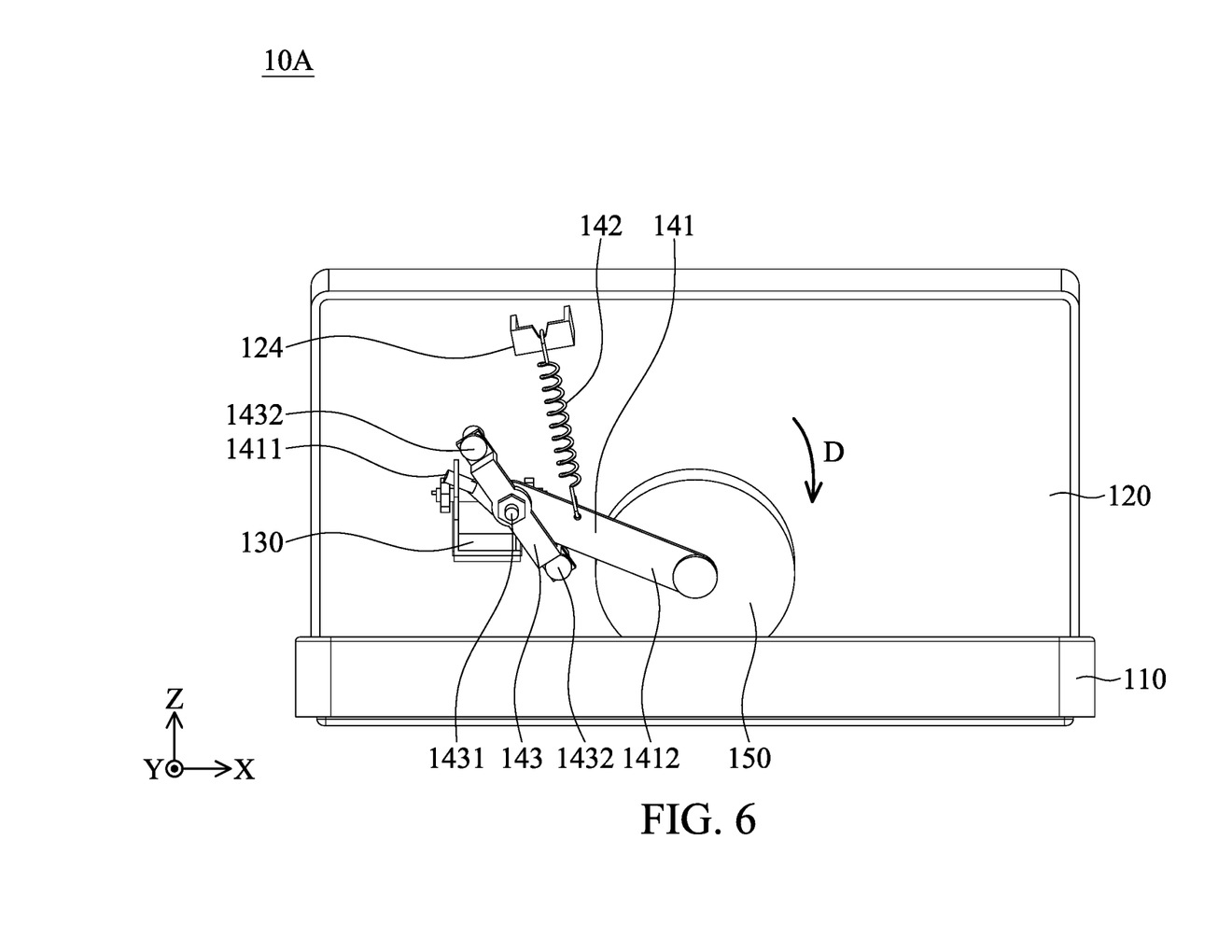
FIG. 6 illustrates a rear view of the electronic assembly in accordance with some embodiments of the present disclosure.
Figure 7:
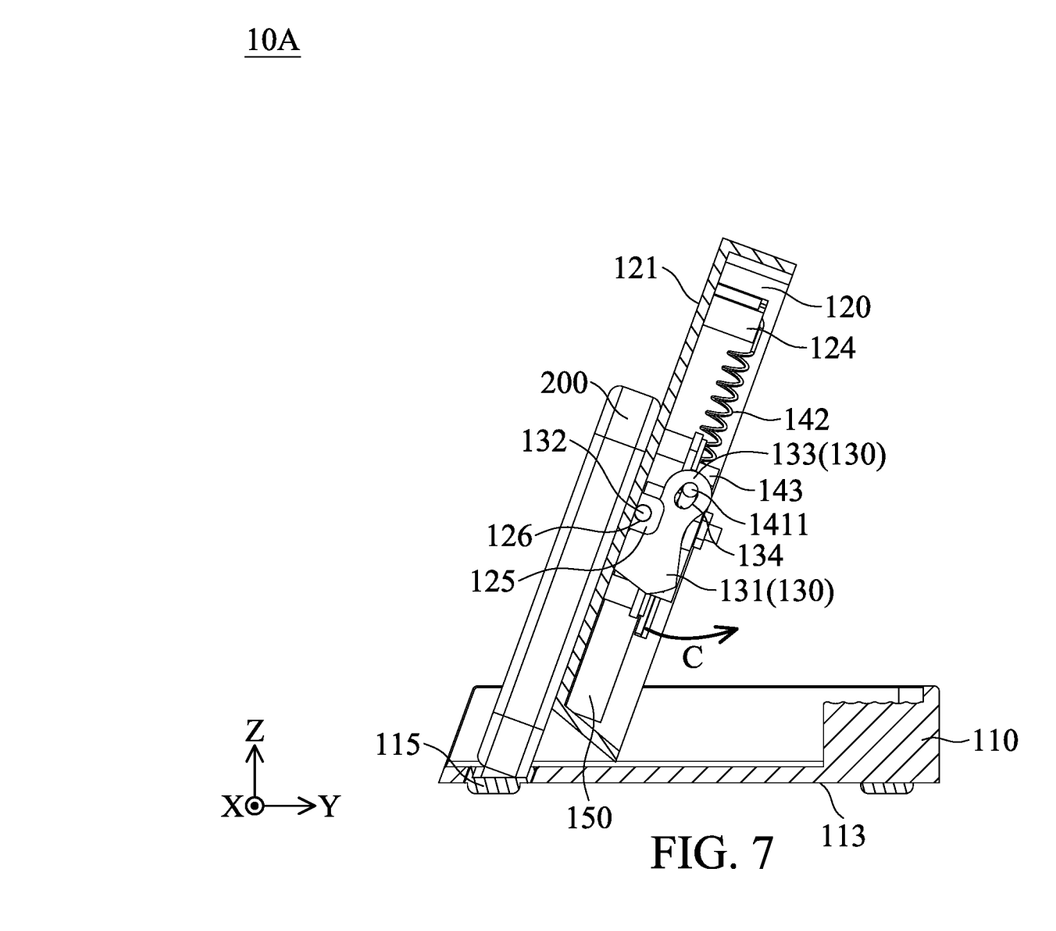
FIG. 7 illustrates a cross-sectional view of the electronic assembly in accordance with some embodiments of the present disclosure.

FIGS. 6 and 7 illustrate a rear view and a cross-sectional view of the electronic assembly 10A in accordance with some embodiments of the present disclosure. As shown in FIGS. 6 and 7, Since the positioning member 130 rotates relatively to the holder 120 and the protruding post 132 is disposed between the abutting portion 131 and the extending portion 133, when the abutting portion 131 rotates toward the base 110 in the direction C (for example, in a counterclockwise direction), the extending portion 133 rotates in a direction away from the base 110, so that the first end 1411 of the connecting rod 141 is driven by the extending portion 133 of the positioning member 130 to lift up away from the base 110. At this time, the first end 1411 of the connecting rod 141 is located at an end, that is away from the end of the protruding pillar 132, of the hole 134 in the positioning member 130. In this way, the connecting rod 141 rotates in a clockwise direction relative to the fixed rod 143 about the fixed member 1431, which serves as the rotation axis. Therefore, the power assembly 150 is driven by the connecting rod 141 to rotate from the initial position in the direction D (for example, in a clockwise direction). At this time, the restoring member 142 is driven by the connecting rod 141 to stretch.

In addition, when the electronic device 200 is removed from the supporter 100, the restoring member 142 returns from the stretched state to the contracted state, and drives the connecting rod 141 to rotate in the opposite direction D to return to the initial position. At this time, the position of the first end 1411 of the connecting rod 141 in the hole 134 moves from the end away from the protruding pillar 132 to the end close to the protruding pillar 132. Therefore, the positioning member 130 is driven to rotate in the opposite direction C to restore. In this embodiment, when the electronic device 200 is placed horizontally and the positioning member 130 is pushed, the power assembly 150 will move downwardly and correspond to the center of the electronic device 200, so that the charging efficiency for the electronic device 200 can still be maintained well. As such, no matter whether the electronic device 200 is installed on the supporter 100 in an upright or horizontal manner, the power assembly 150 is capable of corresponding to the center of the electronic device 200, thereby maintaining a good charging efficiency of the electronic device 200.

Figure 8:
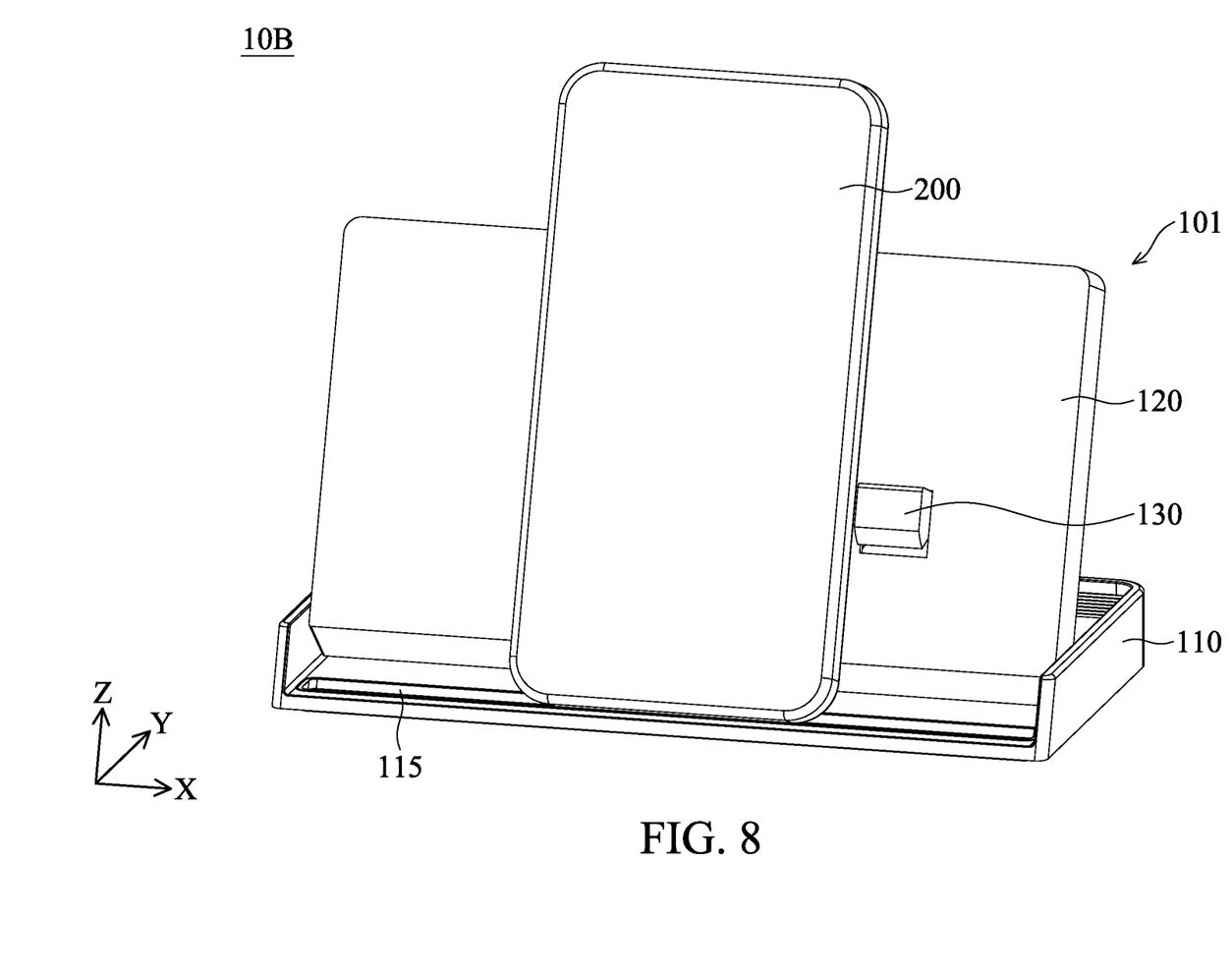
FIG. 8 illustrate a perspective view of the electronic assembly in accordance with some embodiments of the present disclosure.
Figure 9:
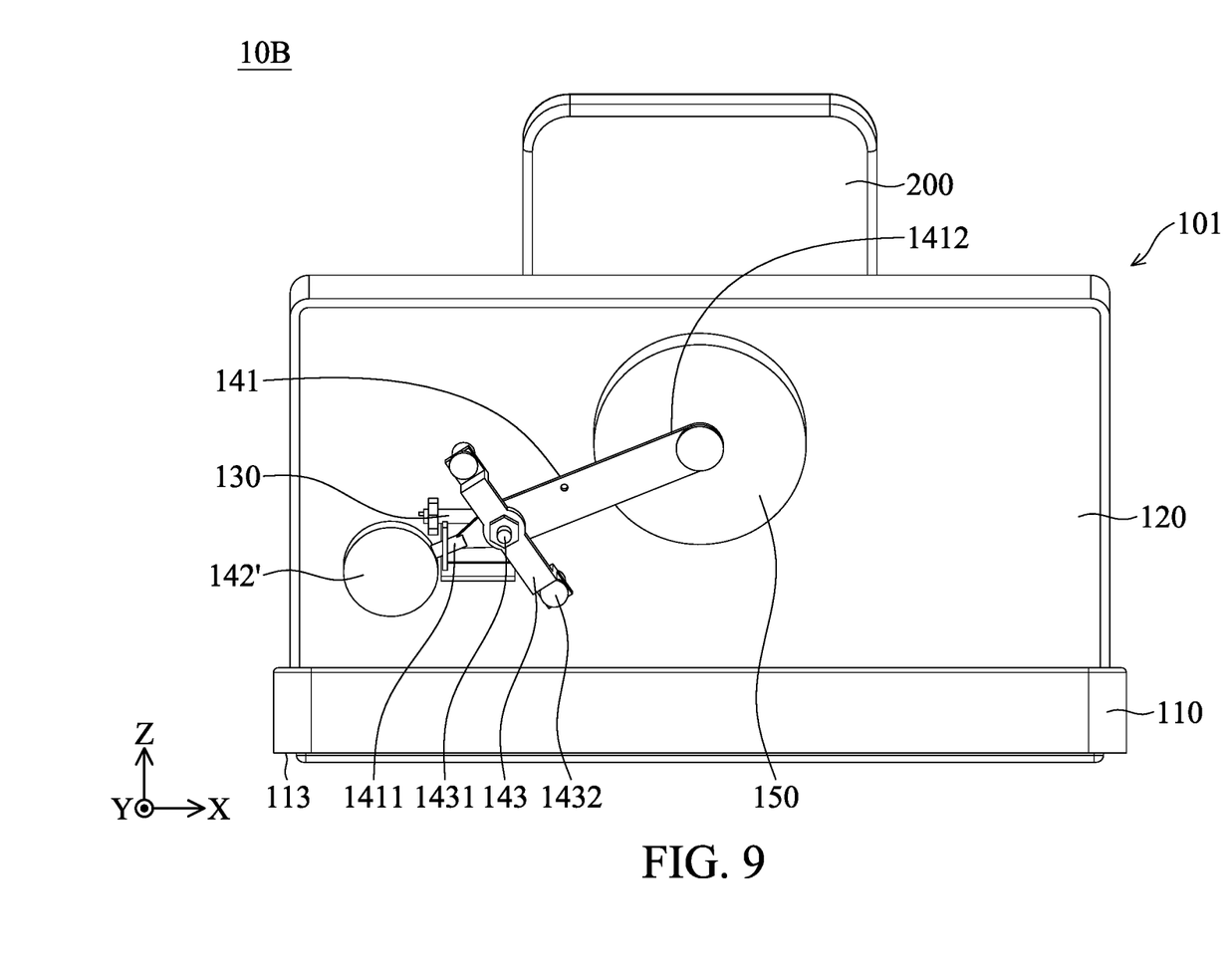
FIG. 9 illustrates a rear view of the electronic assembly in accordance with some embodiments of the present disclosure.

FIG. 8 illustrates a perspective view of the electronic assembly 10B in accordance with some embodiments of the present disclosure. FIG. 9 illustrates a rear view of the electronic assembly 10B in accordance with some embodiments of the present disclosure. It should be understood that the supporter 101 shown in this embodiment may include the same or similar elements or parts as the supporter 100 shown in FIG. 2. For the sake of brevity, these same or similar parts will be labeled with the same or similar reference numerals, and related detailed descriptions may be omitted below. The difference between the supporter 101 shown in this embodiment and the supporter 100 shown in FIG. 2 is that: in this embodiment, the restoring member 142' may be a counterweight block. The restoring member 142' has a gravitational force facing the ground (for example, toward and substantially perpendicular to the lower surface 113 of the base 110). The gravitational force may be applied to the connecting rod 141 for positioning the positioning member 130 and the power assembly 150 at a specific position. In some embodiments, the restoring member 142' may be connected to the first end 1411 of the connecting rod 141, and the restoring member 142' and the power assembly 150 may be located on opposite sides of the fixed member 143, respectively. In some embodiments, the positioning member 130 is located between the restoring member 142' and the power assembly 150.

Figure 10:
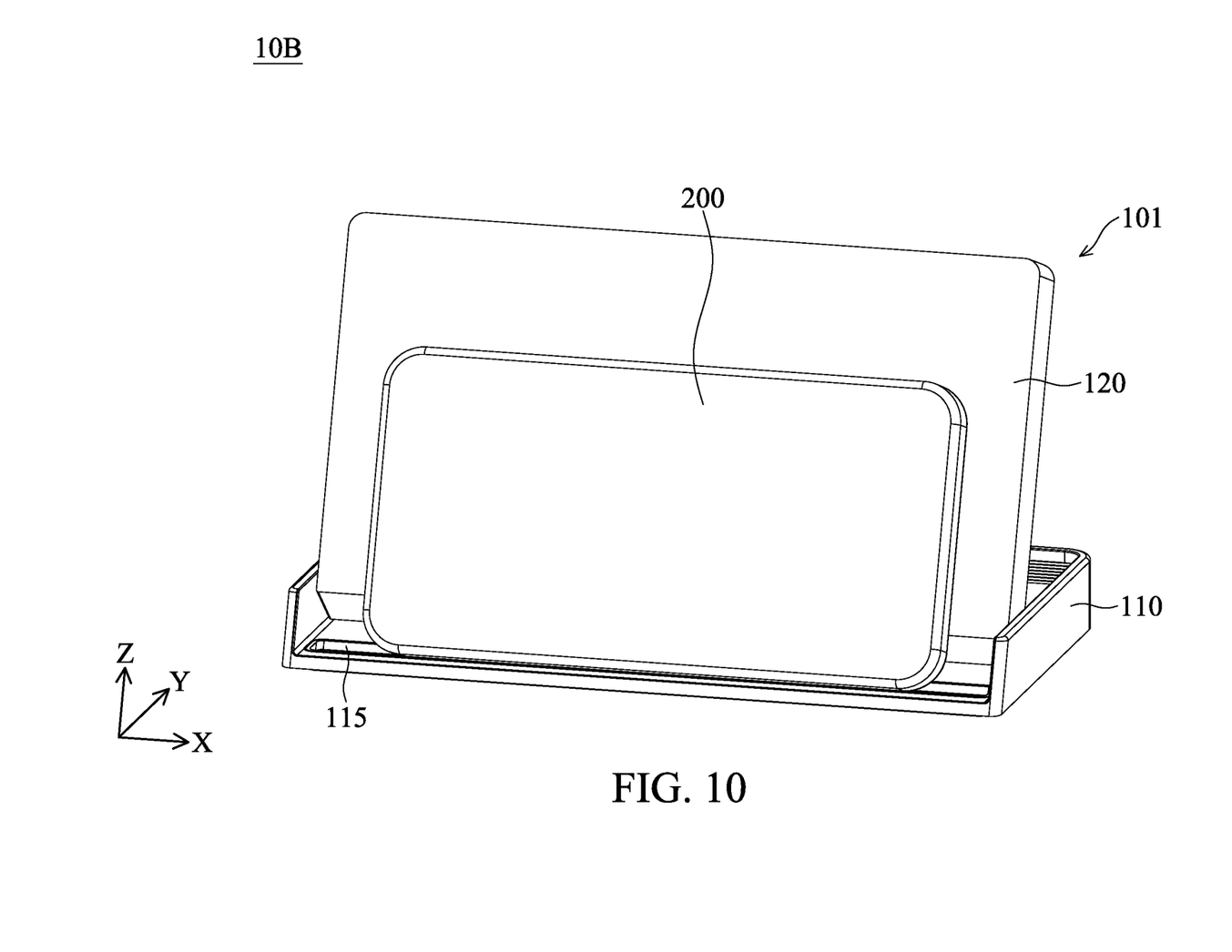
FIG. 10 illustrates a perspective view of the electronic assembly in accordance with some embodiments of the present disclosure.

FIG. 10 illustrates a perspective view of the electronic assembly 10B in accordance with some embodiments of the present disclosure. As shown in FIG. 10, the electronic device 200 may be disposed on the slot 115 in a horizontal manner, that is, the long side of the electronic device 200 abuts the slot 115. At this time, the electronic device 200 abuts the holder 120 and contacts the abutting portion 131 of the positioning member 130. Therefore, the weight of the electronic device 200 may push the positioning member 130 and force the positioning member 130 to rotate toward the rear surface 122 relative to the holder 120. The movement mode of the positioning member 130 will be further described below.

Figure 11:
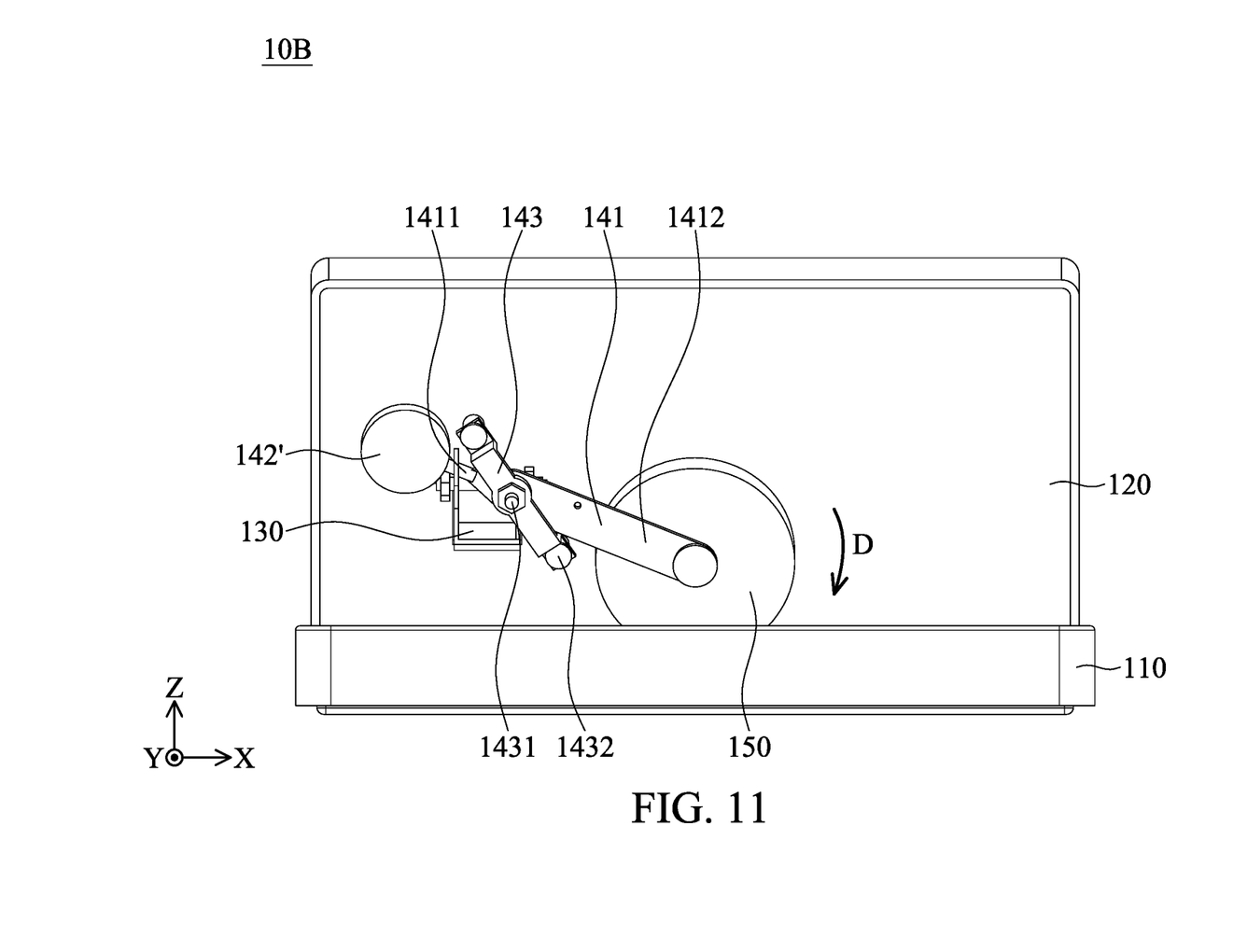
FIG. 11 illustrates a rear view of the electronic assembly in accordance with some embodiments of the present disclosure.

FIG. 11 illustrates a rear view of the electronic assembly 10B in accordance with some embodiments of the present disclosure. As shown in FIG. 11, since the positioning member 130 rotates relatively to the holder 120, the protruding post 132 is provided between the abutting portion 131 and the extending portion 133. When the abutting portion 131 faces the base 110 along the direction C (for example, When rotating counterclockwise), the extending portion 133 rotates away from the base 110, so that the first end 1411 of the connecting rod 141 is driven by the extending portion 133 of the positioning member 130 to lift up away from the base 110. At this time, the first end 1411 of the connecting rod 141 is located at the end, which is away from the protruding pillar 132, of the hole 133 of the positioning member 130. As such, the connecting rod 141 rotates, for example, in a clockwise direction relative to the fixed rod 143 about the fixed member 1431, which serves as a rotation axis. In the present embodiment, the power assembly 150 is driven by the connecting rod 141 to rotate in a direction D (for example, a clockwise direction). At this time, the restoring member 142' will also be driven by the positioning member 130 to move upwardly away from the base 110.

In addition, when the electronic device 200 is removed from the supporter 100, the restoring member 142' moves back to its initial position due to gravity and drives the connecting rod 141 to rotate in the opposite direction D to move back to its initial position. At this time, the position of the first end 1411 of the connecting rod 141 in the hole 134 moves from the end away from the protruding post 132 to the end close to the protruding post 132, and drives the positioning member 130 to rotate in the opposite direction C to moves back to its initial position. In this embodiment, when the electronic device 200 is disposed horizontally and pushes the positioning member 130, the power assembly 150 would move toward the base 110 and correspond to the center of the electronic device 200, so that the charging efficiency for electronic device 200 may still be maintained well. In this way, no matter whether the electronic device 200 is disposed on the supporter 101 in a upright or horizontal manner, the power assembly 150 can correspond to the center of the electronic device 200, thereby maintaining a good charging efficiency of the electronic device 200.

In summary, the present disclosure provides a supporter and an electronic assembly including a power assembly that is movable in accordance with the position of the electronic device. With the arrangement of the positioning member, the upright electronic device may correspond to the position of the power assembly, so as to achieve a good charging efficiency. In addition, when the electronic device is placed horizontally, the electronic device pushes the positioning member to rotate, driving the connecting rod and the power assembly to move correspondingly, so that the position of the power assembly corresponds to the center of the electronic device and still maintains a good charging efficiency. Furthermore, the supporter of the present disclosure also enables the horizontally placed electronic device to be close to the bottom of the supporter, so that it may be both functional and good-looking, and therefore meet the needs of consumers.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A supporter, comprising:
   a base;
   a holder connected to the base and having a through-hole on a surface of the holder;
   a positioning member movably disposed in the through-hole of the holder;
   a connecting rod assembly disposed on the holder and connected to the positioning member; and
   a power assembly movably disposed on the holder via the connecting rod assembly, wherein the power assembly is rotatable about a central axis perpendicular to the surface.

2. The supporter as claimed in claim 1, wherein the connecting rod assembly comprises a connecting rod, the connecting rod has a first end and an opposite second end, the first end is connected to the positioning member, and the second end is connected to the power assembly.

3. The supporter as claimed in claim 2, wherein the connecting rod assembly comprises a fixed rod disposed on the holder and pivoted to the connecting rod, and the connecting rod is disposed on the holder via the fixed rod.

4. The supporter as claimed in claim 2, further comprising a restoring member connected to the connecting rod so that the connecting rod drives the power assembly to move.

5. The supporter as claimed in claim 4, wherein the restoring member is disposed between the fixed rod and the power assembly.

6. The supporter as claimed in claim 5, wherein the restoring member is a spring.

7. The supporter as claimed in claim 4, wherein the restoring member is disposed on the first end of the connecting rod.

8. The supporter as claimed in claim 7, wherein the restoring member is a counterweight block.

9. The supporter as claimed in claim 2, wherein the positioning member has a hole, a size of the hole on a plane is greater than a size of the first end of the connecting rod on the plane so that the first end is movably disposed in the hole of the positioning member.

10. A supporter configured to hold an electronic device, comprising:
    a base;
    a holder connected to the base and having a through-hole on a surface of the holder;
    a positioning member movably disposed in the through-hole of the holder;
    a connecting rod assembly disposed on the holder and connected to the positioning member; and
    a power assembly movably disposed on the holder via the connecting rod assembly,
    wherein the electronic device abuts against the holder and the base and is electrically connected to the power assembly, and the power assembly is rotatable about a central axis perpendicular to the surface.

11. The supporter as claimed in claim 10, wherein the connecting rod assembly comprises a connecting rod, the connecting rod has a first end and an opposite second end, the first end is connected to the positioning member, and the second end is connected to the power assembly.

12. The supporter as claimed in claim 11, wherein the connecting rod assembly comprises a fixed rod disposed on the holder and pivoted to the connecting rod, and the connecting rod is disposed on the holder via the fixed rod.

13. The supporter as claimed in claim 11, further comprising a restoring member connected to the connecting rod so that the connecting rod drives the power assembly to move.

14. The supporter as claimed in claim 11, wherein the positioning member has a hole, a size of the hole on a plane is greater than a size of the first end of the connecting rod on the plane so that the first end is movably disposed in the hole of the positioning member.

15. The supporter as claimed in claim 10, wherein the base comprises a stopping portion configured to abut the electronic device and limit the electronic device at a position where the electronic device abuts against the holder.

16. The supporter as claimed in claim 15, wherein the stopping portion is a recess or a protruding portion.

* * * * *